US009529270B2

(12) United States Patent
Mori

(10) Patent No.: US 9,529,270 B2
(45) Date of Patent: Dec. 27, 2016

(54) LITHOGRAPHY APPARATUS, AND METHOD OF MANUFACTURING ARTICLE

(71) Applicant: CANON KABUSHIKI KAISHA, Tokyo (JP)

(72) Inventor: Kenichiro Mori, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 118 days.

(21) Appl. No.: 14/452,725

(22) Filed: Aug. 6, 2014

(65) Prior Publication Data

US 2015/0050813 A1 Feb. 19, 2015

(30) Foreign Application Priority Data

Aug. 13, 2013 (JP) ................................ 2013-168335

(51) Int. Cl.
*G03B 27/72* (2006.01)
*G03F 7/20* (2006.01)

(52) U.S. Cl.
CPC ......... *G03F 7/70058* (2013.01); *G03F 7/7055* (2013.01)

(58) Field of Classification Search
CPC ... G03F 7/70058; G03F 7/7055; H01L 21/306
See application file for complete search history.

(56) References Cited

U.S. PATENT DOCUMENTS 5,811,211 A * 9/1998 Tanaka ................ G03F 7/70066 382/145
6,680,774 B1 1/2004 Heinle
8,531,649 B2 * 9/2013 Hirano ................ G03F 7/70066 355/67
8,625,073 B2 * 1/2014 Hirano ................ G03F 7/70066 355/53
9,134,619 B2 * 9/2015 Suzuki .................. G03F 7/7015
2004/0189967 A1 * 9/2004 Ottens ................ G03F 7/70066 355/67
2005/0212156 A1 * 9/2005 Tokita .................. B29C 43/003 264/1.36
2008/0297748 A1 * 12/2008 Smeets ............... G03F 7/70216 355/53
2011/0267595 A1 * 11/2011 Mori .................. G03F 7/70066 355/67
2013/0078820 A1 * 3/2013 Mikami ................ G03F 7/0002 438/778

FOREIGN PATENT DOCUMENTS

JP 2-51254 B2 11/1990
JP 2011-233781 A 11/2011

* cited by examiner

*Primary Examiner* — Deoram Persaud
(74) *Attorney, Agent, or Firm* — Rossi, Kimms & McDowell LLP

(57) ABSTRACT

A lithography apparatus includes: a shield including a shield member having an aperture formed therein and having a first edge and a second edge defining the aperture; a driving mechanism including a rotation mechanism configured to rotate the shield member and a translation mechanism configured to translate the shield member; and a controller configured to control the driving mechanism so as to sequentially perform patterning.

15 Claims, 4 Drawing Sheets

1
2
3
4
5
6
7
8
9
10
11
12
13
14

F I G. 5
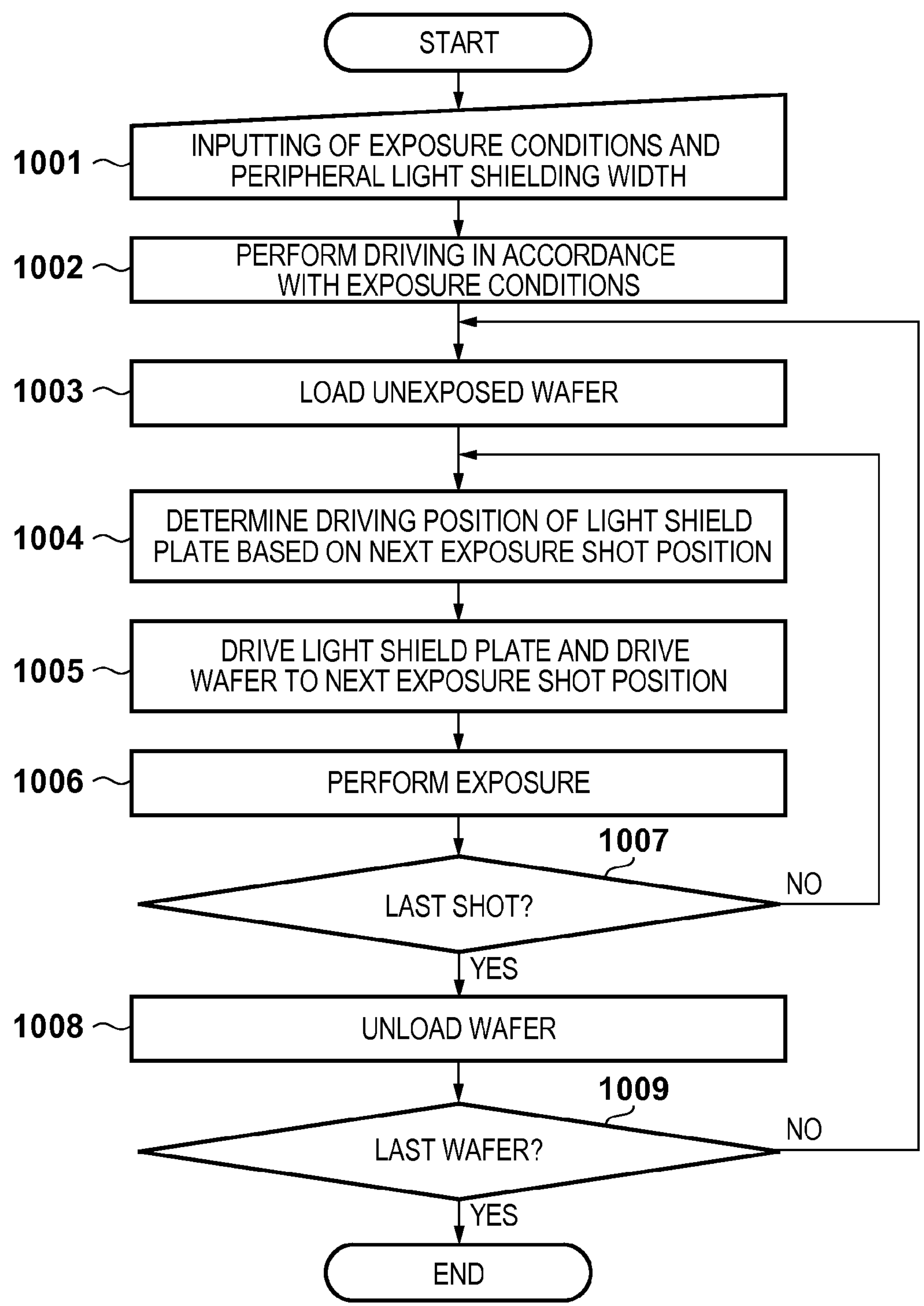

LITHOGRAPHY APPARATUS, AND METHOD OF MANUFACTURING ARTICLE

BACKGROUND OF THE INVENTION

Field of the Invention

The present invention relates to a lithography apparatus and a method of manufacturing an article.

Description of the Related Art

Recently, semiconductor devices have been increasingly mounted using a flip-chip mounting technique. A semiconductor device manufacturing process corresponding to the flip-chip mounting technique includes a step of manufacturing solder balls or rewirings on a device. As a method of forming solder balls or rewirings, a formation method using plating is available. In order to form solder balls or rewirings by plating, it is necessary to establish electrical connection between the conductive film formed on a wafer (to be sometimes referred to as a substrate) and the electrode of a plating apparatus by making them come into contact with each other. Japanese Patent Publication No. 2-51254 has proposed a method of establishing electrical connection between a conductive film and the electrode of a plating apparatus by peeling off a resist film formed on the conductive film at a peripheral portion of a wafer.

If a resist is of a negative type (negative resist), a peripheral portion of a wafer may just be prevented from being irradiated with light during exposure. U.S. Pat. No. 6,680,774 has proposed a method of performing exposure upon arranging a light shield plate on a wafer.

Japanese Patent Laid-Open No. 2011-233781 has proposed a method of shielding a peripheral portion of a wafer from light by rotating and linearly driving a light shield plate having an arc.

In the method of performing light shielding by rotating and linearly driving a light shield plate as disclosed in Japanese Patent Laid-Open No. 2011-233781, restrictions in terms of cable mounting or the design of a driving mechanism limit the rotation range of the light shield plate. The limitation of the rotation range can decrease productivity.

In addition, in order to improve the productivity of an exposure apparatus, a stage holding a wafer can often be driven at very high speed. For this reason, the productivity will decrease unless a very high-speed driving mechanism is employed as a driving mechanism which rotates/drives a light shield plate.

The present invention provides, for example, a lithography technique advantageous in terms of productivity.

SUMMARY OF THE INVENTION

According to one aspect of the present invention, there is provided a lithography apparatus which performs patterning on a photosensitive material on a substrate, the apparatus comprising: a shield including a shield member having an aperture formed therein and having a first edge and a second edge defining the aperture, and configured to shield the substrate with a shield region of the shield member including one of the first edge and the second edge with respect to a peripheral region of the substrate; a driving mechanism including a rotation mechanism configured to rotate the shield member and a translation mechanism configured to translate the shield member, and configured to change a shield region of the substrate by the shield member; and a controller configured to control the driving mechanism so as to sequentially perform first patterning on peripheral shot regions from a peripheral shot region corresponding to a position of one end of a rotation range of the rotation mechanism to a peripheral shot region corresponding to a position of the other end of the rotation range using the shield region including the first edge, and thereafter sequentially perform second patterning on peripheral shot regions from a peripheral shot region corresponding to the position of the other end to a peripheral shot region corresponding to the position of the one end using the shield region including the second edge.

Further features of the present invention will become apparent from the following description of exemplary embodiments (with reference to the attached drawings).

BRIEF DESCRIPTION OF THE DRAWINGS

FIG. 5 is a flowchart for explaining an exposure method according to the embodiment.

DESCRIPTION OF THE EMBODIMENTS

Embodiments of the present invention will be exemplarily described in detail below with reference to the accompanying drawings. Note that the constituent elements described in the embodiments are merely examples. The technical scope of the present invention is determined by the scope of claims and is not limited by the following individual embodiments.

Figure 1:
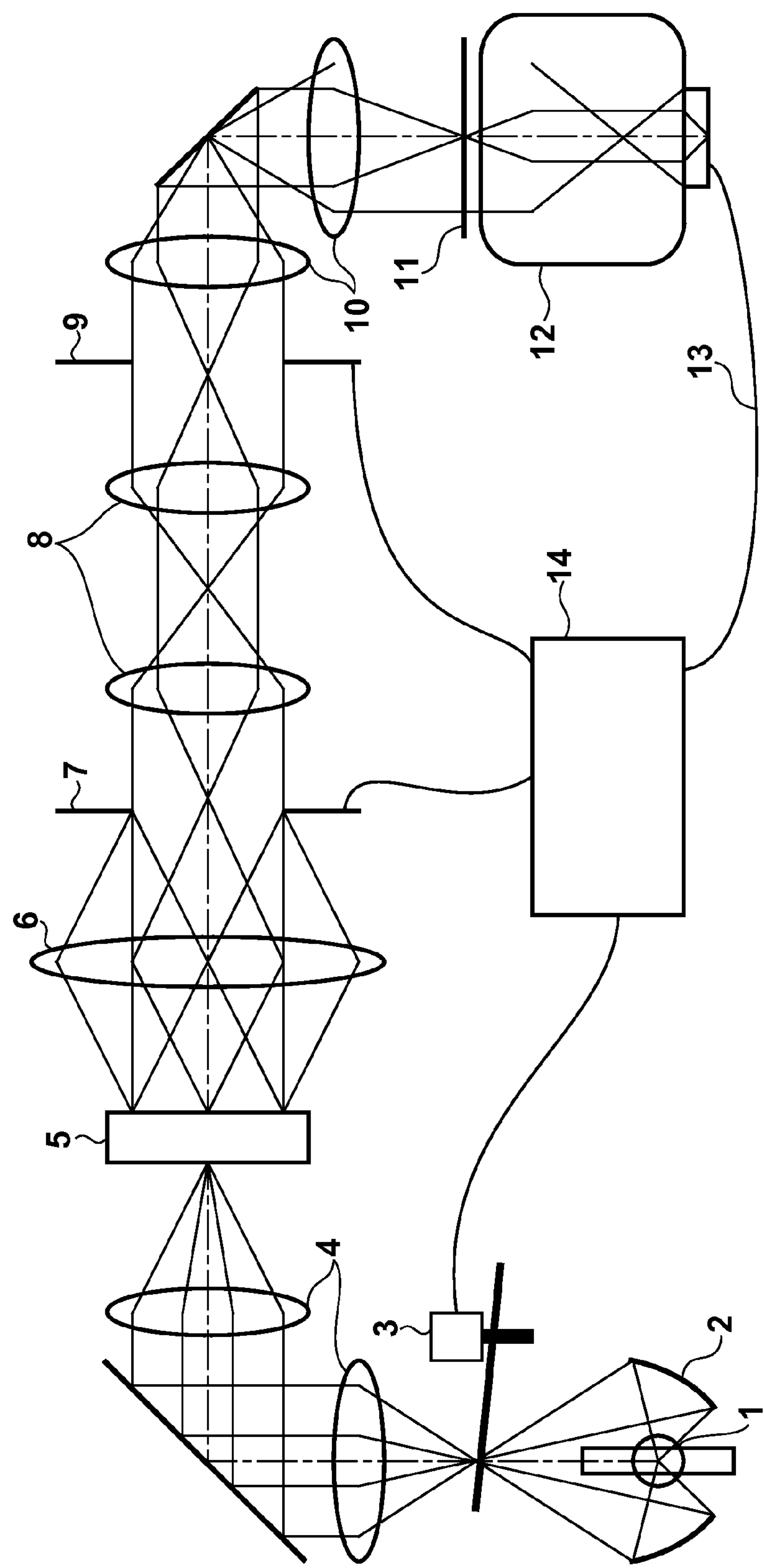
FIG. 1 is a view showing an exposure apparatus according to an embodiment.

FIG. 1 shows a lithography apparatus according to an embodiment, which performs patterning on a photosensitive material applied on a substrate. The lithography apparatus which performs patterning on a photosensitive material on a substrate includes a shield portion which shields a substrate, a driving mechanism for changing a substrate shield region by a shield member of the shield portion, and a controller which controls the driving mechanism. The lithography apparatus also includes an irradiation system which irradiates a molded light-curing photosensitive material with light. In addition, the lithography apparatus includes a projection system which projects an original pattern onto a substrate.

The shield portion includes a shield member having an aperture formed in it and first and second edges defining the aperture.

The shield portion shields a substrate from a peripheral region of the substrate by a shield region of the shield member including one of the first and second edges. The driving mechanism includes a rotation mechanism which rotates the shield member and a translation mechanism which translates the shield member, and changes the substrate shield region by the shield member by driving at least one of the rotation mechanism and the translation mechanism. The controller controls the driving mechanism so as to sequentially perform the first patterning on peripheral shot regions from a peripheral shot region corresponding to the position of one end of the rotation range of the rotation mechanism to a peripheral shot region corresponding to the position of the other end of the rotation range by using the shield region including the first edge. After the first patterning, the controller controls the driving mechanism so as to sequentially perform the second patterning on the peripheral shot regions from the peripheral shot region corresponding to the position of the other end to the peripheral shot region corresponding to the position of one end by using the shield region including the second edge.

This embodiment will exemplify an exposure apparatus as a lithography apparatus, which forms an original (latent image) pattern on a shot region by projecting the original pattern onto the shot region by using a projection optical system.

FIG. 1 shows an example of an extra high pressure mercury lamp as a light source 1. However, an excimer laser may be used. An elliptical mirror is generally used as a condensing mirror 2. A facet mirror optimized to increase the degree of focusing of a focal point or the like may be used instead of the elliptical mirror. A shutter 3 adjusts the exposure amount on a substrate (wafer) 13 coated with a photosensitive material (photosensitive agent) (to be described later) by adjusting the opening/closing time. The exposure apparatus needs to change a coherence factor (σ value) in order to optimize the imaging performance of the projection optical system in accordance with a pattern to be transferred. The σ value is given by [(NA of illumination optical system)÷(NA of projection optical system)], and can change by changing a light beam diameter on a fly-eye lens 5 deciding the NA of illumination optical system.

A variable magnification relay optical system 4 has a zoom mechanism and can change a light beam diameter on the fly-eye lens 5. A cylindrical lens array may be used in place of the fly-eye lens 5. The fly-eye lens 5 divides the wavefront of a light beam on the incident surface to generate a secondary light source on the exit surface. A condenser optical system 6 superimposes the light beams wavefront-divided by the fly-eye lens 5 on an illuminated plane. This can achieve a uniform illuminance distribution on the illuminated plane.

A masking blade 7 is arranged on the illuminated plane of the condenser optical system 6. The masking blade 7 is a stop having a variable aperture and determines the shape (shot shape) of one shot region onto which transfer is repeatedly performed by step-and-repeat operation by the exposure apparatus. That is, the masking blade 7 forms the second light shield plate which shields a region outside a straight side defining the outer edge of a shot region so as to prevent light from entering. A relay optical system 8 projects the illuminance distribution formed at the position of the masking blade 7 onto a light shield plate 9. A relay optical system 10 projects the illuminance distribution formed at the position of the light shield plate 9 onto an original (reticle) 11. The above members ranging from the light source 1 to the relay optical system 10 constitute an illumination system (irradiation system) which illuminates (irradiates) the original (reticle) 11 with light. The rotation mechanism rotates the light shield plate 9 about an axis parallel to the optical axis of the illumination system for illuminating an original with light. The translation mechanism translates the light shield plate 9 along a plane perpendicular to the optical axis.

The light shield plate 9 (to be also referred to as a shield plate or shield member) can change the shape of a region onto which a pattern is transferred in accordance with an exposure position on the wafer 13, when the exposure apparatus repeatedly performs exposure by step-and-repeat operation. The light shield plate 9 forms a shield plate which includes, at its edges, arcs each overlapping a circular boundary line located inwardly, by a predetermined width, from the outer circumference of a substrate which defines a transfer region of the substrate onto which a pattern is transferred, and shields an outer circumferential region outside the circular boundary line on the substrate so as to prevent light from entering. This embodiment has exemplified the arrangement in which the masking blade 7 and the light shield plate 9 are arranged at different positions optically conjugate to each other inside the irradiation system by using the relay optical system 8 for the sake of arrangement.

If there is no problem in terms of arrangement, the masking blade 7 may be arranged adjacent to the light shield plate 9. Assume that the masking blade 7 is arranged adjacent to the light shield plate 9, but they cannot be arranged at substantially the same position. In this case, the light shield plate 9 is arranged at a position optically conjugate to the wafer 13, and the masking blade 7 is arranged at a defocused position. If the defocus amount on the arrangement cannot be allowed, the masking blade 7 shields light so as to prevent light from entering a region, of a shot region, which is located outside a straight side defining an outer edge along the first direction (a direction perpendicular to a scanning direction in the case of a scanning exposure apparatus). A light shield portion which shields light by using a Cr pattern is provided on the reticle (original) 11 to prevent light from entering a region, of a shot region, which is located outside a straight side defining an outer edge along the second direction perpendicular to the first direction. In addition, the shape of a shot region may be determined by the Cr pattern on the reticle 11, and the masking blade 7 may shield light by an aperture region larger than the shape of the shot region so as to reduce exposure due to a Cr defect on the reticle 11. The arrangement order of the masking blade 7 and the light shield plate 9 in the irradiation system is not specifically limited, and any of them can be located on the light source 1 side.

The relay optical system 10 projects the illuminance distribution formed at the position of the light shield plate 9 onto the reticle 11. The circuit pattern to be transferred is formed on the reticle (to be sometimes referred to as a mask) 11. A projection optical system 12 projects the pattern formed on the reticle 11 onto the wafer (to be sometimes referred to as a substrate) 13 coated with a photosensitive agent (to be sometimes referred to as a resist). A controller (computer) 14 controls the exposure apparatus to expose the wafer 13.

Figure 2:
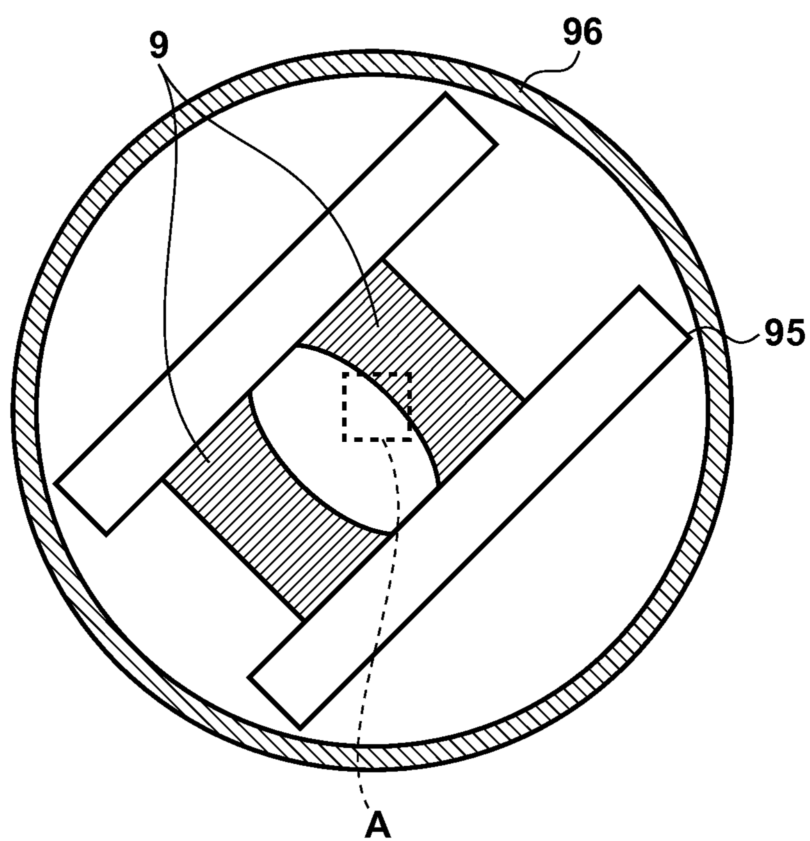
FIG. 2 is a view for explaining a light shield plate according to the embodiment.

The light shield plate 9 will be described in detail below. FIG. 2 shows an embodiment of the light shield plate 9. FIG. 2 shows the light shield plate 9 viewed from the transverse (horizontal) direction within the drawing surface in FIG. 1. The region surrounded by the dotted line indicated by “A” in FIG. 2 indicates the shape of a shot region on the light shield plate 9. If this shot region lacks an upper right region, the lacking region can be shielded from light by the light shield plate 9. As shown in FIG. 2, the light shield plate 9 has an aperture. The edge of the aperture has the first arc (first edge) and the second arc (second edge) which are arranged at opposite positions (facing each other). The first and second arcs each have a convex shape in a direction from the inside to the outside of the aperture. The radius of each arc is equal to the value obtained by subtracting a light shielding width d of an outer circumferential region from the radius of the wafer 13 when the arc is projected onto the wafer 13 by the projection optical system 12. The aperture has arcs. However, if a light shield region around the wafer 13 is allowed to have a polygonal shape, the aperture may have straight edges. The light shield plate 9 shields light by using one of the first and second arc edges in accordance with a peripheral shot region on a substrate, thereby defining a region (exposure region) onto which a pattern is transferred (formed).

A driving unit 96 is the first driving unit which rotates/drives the light shield plate 9 within a rotation range around an axis parallel to the optical axis of the irradiation system. A driving unit 95 is the second driving unit which straightly drives (translates) the light shield plate 9 in a moving radius direction within a plane perpendicular to the optical axis of the irradiation system. In the case shown in FIG. 2, the driving unit 95 is also rotated/driven by the driving unit 96. This rotation axis matches the optical axis. Note that it is possible to use another form as long as it can drive the light shield plate 9 in the moving radius direction and the rotating direction with respect to the optical axis. The driving unit 96 has a rotation range less than 360°. The two arcs cooperatively cover this rotation range. For example, one arc shields outer circumferential regions in the first and second quadrants of the wafer 13, while the other arc shields outer circumferential regions in the third and fourth quadrants.

Figure 3:
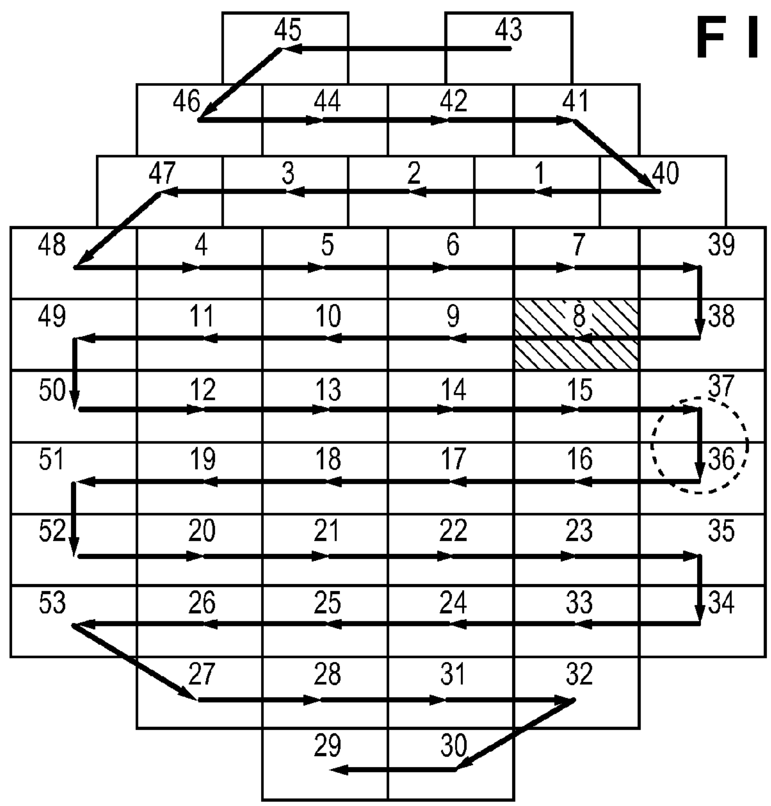
FIG. 3 is a view showing the exposure procedure of shots on a wafer.

The following is a specific example of an exposure order and how the light shield plate 9 is rotated/driven when a light shield plate has an edge in charge of the first and second quadrants of a wafer and an edge in charge of the third and fourth quadrants. FIG. 3 exemplarily shows the exposure order of shots on a wafer as a conventional exposure order. The arrows in FIG. 3 indicate an exposure order that minimizes the step distance of the stage holding the wafer. Assume that exposure is performed in this exposure order. In this case, when moving between the shot regions surrounded by the dotted line, the light shield plate needs to be rotated/driven through 180° to switch from the edge of the light shield plate in charge of the first quadrant to the edge of the light shield plate in charge of the fourth quadrant. The productivity of the exposure apparatus is more effectively improved by shortening the time taken to rotate/drive the light shield plate through 180° than by shortening the step time of the stage holding the wafer.

Assume that a time T1 taken to step the stage holding the wafer 13 is 0.1 sec, a time T2 taken to linearly drive the light shield plate is 1 sec, a time T3 taken to rotate/drive the light shield plate through 20° or less is 1 sec, and a time T4 taken to rotate/drive the light shield plate through 180° is 5 sec. In this case, the time T1 taken between shots without driving of the light shield plate is 0.1 sec, the time T4 taken between shots with the light shield plate being rotated/driven through 180° is 5 sec, and T2=T3 taken between shots with the light shield plate being driven through an angle other than 180° is 1 sec.

When exposure is performed according to the conventional exposure order like that indicated by the arrows in FIG. 3, which minimizes the step distance of the stage holding the wafer 13, the light shield plate is moved 19 times between shots without being driven. In addition, there are one shot with the light shield plate being rotated/driven through 180°, and 32 shots with the light shield plate being driven through angles other than 180°. That is, it takes 38.9 sec per wafer to move between the shots. Note that after exposure is performed in the first quadrant while a peripheral portion is shielded from light, exposure is performed on a plurality of shots in a central portion. When exposure is performed thereafter in the second quadrant while a peripheral portion is shielded from light, since the light shield plate 9 is rotated/driven concurrently with exposure on a plurality of shots in a central portion, a decrease in productivity due to rotation driving with a large angle is suppressed.

Figure 4:
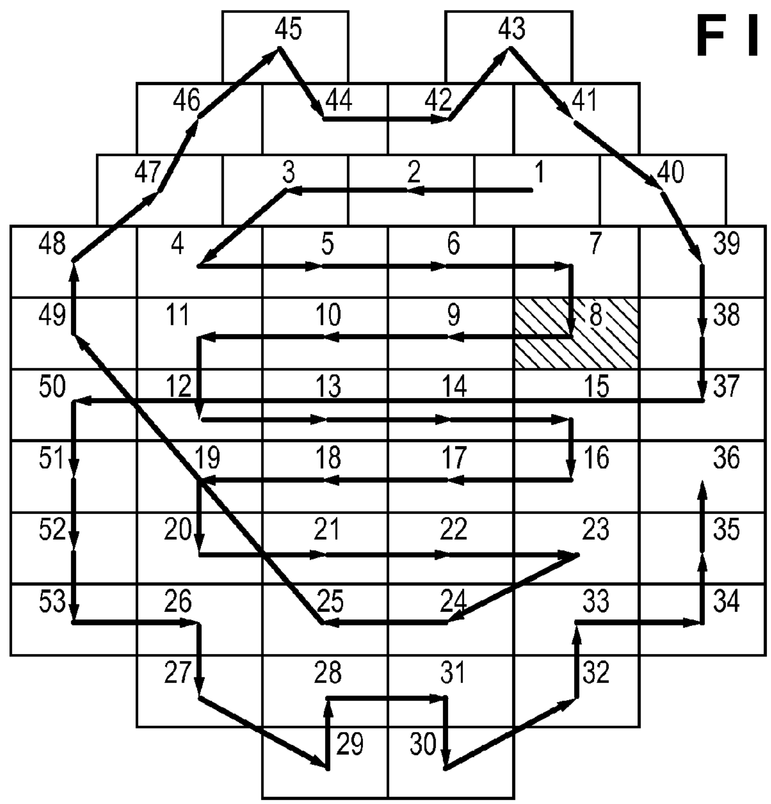
FIG. 4 is a view showing an exposure order of shots on a wafer according to the embodiment.

FIG. 4 shows an exposure order on a wafer according to the embodiment of the present invention. This exposure order has the following two points:

(1) Shots are grouped into shots which require light shielding using the light shield plate and shots which require no light shielding using the light shield plate, thereby decreasing the number of times of driving the light shield plate between the shots which require light shielding using the light shield plate and the shots which require no light shielding.

(2) The arcs of the light shield plate which are used for light shielding are switched from each other by making the light shield plate move across a wafer, instead of rotating/driving the light shield plate through 180°, so as to perform exposure in the order from the first quadrant to the third quadrant instead of driving the light shield plate through 180°.

The computer 14 controls the rotation driving of the light shield plate so as to start transfer from a peripheral shot region corresponding to the position of one end of the rotation range of rotation driving while performing light shielding using the first arc edge of the light shield plate and continuously perform transfer up to a peripheral shot region corresponding to the position of the other end of the rotation range. Subsequently, the computer 14 (controller) controls the rotation driving and linear driving of the light shield plate so as to move the light shield plate across the wafer 13 by linear driving, change peripheral shot regions, and perform transfer on the next peripheral shot region while performing light shielding using the second arc edge of the light shield plate 9.

The computer 14 (controller) divides shot regions into peripheral shot regions on which transfer is performed while being light-shielded by the light shield plate and shot regions which are not light-shielded by the light shield plate, based on input recipe information associated with a substrate (including information of patterning conditions such as a shot layout). The computer 14 (controller) then controls the rotation driving and linear driving of the light shield plate with respect to peripheral shot regions. In this control, the rotation amount of the light shield plate between the last peripheral shot region light-shielded by the first arc edge and the first peripheral shot region light-shielded by the second arc edge is set to 90° or less. That is, the rotation amount of the light shield plate 9 (shield member) between the first patterning using the shield region including the first edge and the second patterning using the shield region including the second edge is 90° or less.

According to this exposure order, the light shield plate 9 is moved 24 times between shots without being driven, and there are 0 shots with the light shield plate 9 being rotated/driven through 180° and 28 shots with the light shield plate 9 being driven through angles other than 180°. As a consequence, the time required to move among the shots per wafer is 30.4 sec. That is, the time required per wafer is shorter than that according to the conventional exposure order shown in FIG. 3 by 8.5 sec, thus achieving an improvement in productivity.

An exposure method in this embodiment will be described in accordance with the flowchart of FIG. 5. In step 1001, an input unit inputs a coherence factor (σ value), shot shape, shot layout, and peripheral light shielding width, and the like (recipe information) to the computer 14 (controller) which controls the exposure apparatus. The computer 14 (controller) specifies a peripheral shot region on a substrate based on the recipe information associated with the substrate. The computer 14 (controller) determines the order of patterning with respect to shot regions on a substrate, and controls the driving mechanism in accordance with the determined order.

In step 1002, the computer 14 drives the variable magnification relay optical system 4 to a predetermined position based on the input recipe (σ value) information, and drives the masking blade 7 based on the input recipe (shot region) information. The computer 14 determines a patterning procedure (including, for example, a driving procedure for the light shield plate in FIG. 4) which maximizes the productivity in accordance with the input recipe information. It is also possible to determine, in advance, a plurality of pieces of procedure information indicating patterning procedures based on recipe information such as a shot layout, driving conditions for the stage (the step time and the like), and driving conditions for the light shield plate. For example, the computer 14 (controller) stores these pieces of procedure information in a storage unit in the computer in advance, and selects (determines) procedure information from the plurality of pieces of procedure information in accordance with the input recipe information. The computer 14 (controller) controls the driving of the stage and the translation driving and rotation driving of the light shield plate based on the selected procedure information. Note that pieces of procedure information can be stored in an external apparatus (for example, an information processing apparatus or storage device) in advance to allow the computer 14 to acquire procedure information in accordance with input recipe information by communication with the external apparatus and control the driving of the light shield plate. In addition, the computer 14 (controller) may perform another type of control.

In step 1003, the unexposed wafer 13 is loaded. In step 1004, the computer 14 determines a driving state of the light shield plate 9 based on the determined procedure information. In step 1005, the computer 14 drives the stage holding the wafer 13 to move a target shot region below the projection optical system 12, and drives the light shield plate 9 to a predetermined state. In step 1006, the computer 14 exposes the wafer 13 with a predetermined exposure amount by controlling the driving of the shutter 3. With this operation, the pattern on the reticle 11 is transferred onto the photosensitive agent on the wafer 13 without exposure on the peripheral light-shielded portion. In step 1007, the computer 14 determines whether all the shot regions on the wafer 13 are exposed. If there is any shot region on which exposure has not been completed, the process returns to step 1004 to proceed with exposure on the next shot region. If exposure on all the shot regions is complete, the exposure processing for the wafer 13 is terminated. In step 1008, the wafer 13 is unloaded. In step 1009, the computer 14 determines whether exposure on all the wafers 13 is complete. If there is any unexposed wafer 13, the process advances to the exposure process for the next wafer 13. If exposure on all the wafers 13 is complete, the exposure processing is terminated.

As described above, this embodiment can provide a lithography apparatus or method which performs patterning by shielding a peripheral portion of a wafer from light and is advantageous in productivity (throughput), even if a driving mechanism for rotating a light shield plate is not a high-speed driving mechanism.

The above embodiment has exemplified the exposure apparatus, as a lithography apparatus, which projects an original pattern onto a shot region on a substrate by using the projection optical system. However, the lithography apparatus is not limited to this. For example, this apparatus may be an apparatus which performs patterning on a substrate with a charged particle beam such as an electron beam or an imprint apparatus which performs an imprint process accompanying irradiation (illumination) of molded light-curing photosensitive resin (resist) with light.

(Method of Manufacturing Article)

A method of manufacturing an article (semiconductor integrated circuit element, liquid crystal display element, recording medium, optical element, or the like) includes a step of transferring (forming) a pattern onto a substrate (wafer, glass plate, or film-like substrate) by using the above lithography apparatus. This manufacturing method can further include a step of performing at least one of developing or etching on a substrate on which a pattern is transferred. The manufacturing method can include another process of processing the substrate on which the pattern is transferred. The present invention has been described with reference to the above embodiment. However, the present invention is not limited to the embodiment described above, and various modifications and changes can be made within the scope of the invention.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-168335, filed Aug. 13, 2013, which is hereby incorporated by reference herein in its entirety.

What is claimed is:

1. A lithography apparatus which transfers a pattern to a photosensitive material on each of a plurality of shot regions on a substrate, the plurality of shot regions including peripheral shot regions of a first group and peripheral shot regions of a second group, the peripheral shot regions of the first group including a first peripheral shot region and a second peripheral shot region, the peripheral shot region of the second group including a third peripheral shot region which is arranged adjacent to the first peripheral shot region and a fourth peripheral shot region, the apparatus comprising:

a shield including a shield member having an aperture formed therein and having a first edge and a second edge defining the aperture, and configured to shield a peripheral region of the substrate from irradiation for transferring the pattern with a shield region of the shield member including one of the first edge and the second edge;

a driving mechanism including a rotation mechanism configured to rotate the shield member and a translation mechanism configured to translate the shield member, and configured to change a shield region of the substrate by the shield member in accordance with a peripheral shot region to which the pattern is to be transferred; and a controller configured to control the driving mechanism such that the pattern is sequentially transferred to the peripheral shot regions of the first group from the first peripheral shot region to the second peripheral shot region while shielding the peripheral region with respect to each of the peripheral shot regions of the first group, to which the pattern is transferred, using the shield region including the first edge, and thereafter the pattern is sequentially transferred to the peripheral shot regions of the second group from the third peripheral shot region to the fourth peripheral shot region while shielding the peripheral region with respect to each of the peripheral shot regions of the second group, to which the pattern is transferred, using the shield region including the second edge.

2. The apparatus according to claim 1, wherein a rotation amount of the shield member between the pattern transfer to the second peripheral shot region and the pattern transfer to the third peripheral shot region is not greater than 90°.

3. The apparatus according to claim 1, wherein the controller is configured to specify the peripheral shot regions of the first group and the peripheral shot regions of the second group on the substrate based on recipe information associated with the substrate.

4. The apparatus according to claim 1, wherein the controller is configured to determine an order in which the pattern transfer is performed with respect to shot regions on the substrate based on recipe information associated with the substrate, and control the driving mechanism based on the determined order.

5. The apparatus according to claim 4, further comprising a storage configured to store information of a plurality of orders, wherein the controller is configured to determine one of the plurality of orders stored in the storage based on the recipe information.

6. The apparatus according to claim 1, further comprising an illumination system configured to illuminate an original, wherein the rotation mechanism is configured to rotate the shield member with respect to an axis parallel to an optical axis of the illumination system, and the translation mechanism is configured to translate the shield member along a plane orthogonal to the optical axis.

7. The apparatus according to claim 1, wherein a rotation range of the rotation mechanism is 180°.

8. The apparatus according to claim 1, wherein the first edge and the second edge face each other, and each of the first edge and the second edge has a shape convex outward from an inside of the aperture.

9. The apparatus according to claim 6, wherein the shield member is arranged at a position, in the illumination system, optically conjugate with a position of the substrate.

10. The apparatus according to claim 1, further comprising a projection system configured to project a pattern of an original onto the substrate.

11. The apparatus according to claim 1, further comprising an irradiation system configured to irradiate the photosensitive material, which is light-curable and molded by a mold, with light.

12. The apparatus according to claim 1, wherein the fourth peripheral shot region is arranged adjacent to the second peripheral shot region.

13. The apparatus according to claim 1, wherein a rotation direction of the rotation mechanism to change a peripheral shot region to which the pattern is transferred, in a sequence in which the pattern is sequentially transferred to the peripheral shot regions of the first group from the first peripheral shot region to the second peripheral shot region is opposite to a rotation direction of the rotation mechanism to change a peripheral shot region to which the pattern is transferred, in a sequence in which the pattern is sequentially transferred to the peripheral shot regions of the second group from the third peripheral shot region to the fourth peripheral shot region.

14. The apparatus according to claim 1, wherein the plurality of shot regions includes non-peripheral shot regions which are surrounded by the peripheral shot regions, and the pattern is sequentially transferred to the non-peripheral shot regions, wherein the controller is configured to control the driving mechanism in a case where the pattern is sequentially transferred to the non-peripheral shot regions, such that a region around each of the non-peripheral shot regions is not shielded by the shield member.

15. A method of manufacturing an article, the method comprising steps of:

transferring a pattern to a photosensitive material on each of a plurality of shot regions on a substrate using a lithography apparatus, the plurality of shot regions including peripheral shot regions of a first group and peripheral shot regions of a second group, the peripheral shot regions of the first group including a first peripheral shot region and a second peripheral shot region, the peripheral shot region of the second group including a third peripheral shot region which is arranged adjacent to the first peripheral shot region and a fourth peripheral shot region; and processing the substrate having subjected to the patter transfer, wherein the lithography apparatus includes:

a shield including a shield member having an aperture formed therein and having a first edge and a second edge defining the aperture, and configured to shield a peripheral region of the substrate from irradiation for transferring the pattern with a shield region of the shield member including one of the first edge and the second edge;

a driving mechanism including a rotation mechanism configured to rotate the shield member and a translation mechanism configured to translate the shield member, and configured to change a shield region of the substrate by the shield member in accordance with a peripheral shot region to which the pattern is to be transferred; and a controller configured to control the driving mechanism such that the pattern is sequentially transferred to the peripheral shot regions of the first group from the first peripheral shot region to the second peripheral shot region while shielding the peripheral region with respect to each of the peripheral shot regions of the first group, to which the pattern is transferred, using the shield region including the first edge, and thereafter the pattern is sequentially transferred to the peripheral shot regions of the second group from the third peripheral shot region to the fourth peripheral shot region while shielding the peripheral region with respect to each of the peripheral shot regions of the second group, to which the pattern is transferred, using the shield region including the second edge.

* * * * *